(12) United States Patent
Yang

(10) Patent No.: US 8,719,487 B2
(45) Date of Patent: May 6, 2014

(54) DATA SYSTEM WITH MEMORY LINK ARCHITECTURES AND METHOD WRITING DATA TO SAME

(75) Inventor: Jung Woong Yang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 155 days.

(21) Appl. No.: 13/323,878

(22) Filed: Dec. 13, 2011

(65) Prior Publication Data

US 2012/0151128 A1 Jun. 14, 2012

(30) Foreign Application Priority Data

Dec. 13, 2010 (KR) ........................ 10-2010-0126779

(51) Int. Cl.
*G06F 12/00* (2006.01)
(52) U.S. Cl.
USPC ...................................... 711/103; 365/185.33
(58) Field of Classification Search
USPC ...................................... 711/103; 365/185.33
See application file for complete search history.

(56) References Cited

U.S. PATENT DOCUMENTS

| | | | | |
|---|---|---|---|---|
| 2008/0086631 | A1* | 4/2008 | Chow et al. | 713/2 |
| 2008/0294834 | A1* | 11/2008 | Merry et al. | 711/103 |
| 2010/0287424 | A1* | 11/2010 | Kwon | 714/718 |
| 2011/0016267 | A1* | 1/2011 | Lee et al. | 711/103 |
| 2011/0107049 | A1 | 5/2011 | Kwon | |

FOREIGN PATENT DOCUMENTS

| | | |
|---|---|---|
| KR | 1020100121215 A | 11/2010 |
| KR | 1020110041613 A | 4/2011 |
| KR | 1020110048304 A | 5/2011 |

* cited by examiner

*Primary Examiner* — Hashem Farrokh

(74) *Attorney, Agent, or Firm* — Volentine & Whitt, PLLC

(57) ABSTRACT

A system and method that transfers data from a ROM writer to memory socket assemblies (MSAs), each MSA capable of mechanically mounting and thereby electrically connecting a memory link architecture (MLA) and including a memory and a control device. Only after transferring the data from the ROM writer to at least one of the plurality of MSA but before mounting a corresponding MLA in each one of the plurality of MSAs, data is written from a memory in one MSA to a corresponding nonvolatile memory.

20 Claims, 6 Drawing Sheets

DATA SYSTEM WITH MEMORY LINK ARCHITECTURES AND METHOD WRITING DATA TO SAME

CROSS-REFERENCE TO RELATED APPLICATIONS

A claim of priority under 35 U.S.C. §119 is made to Korean Patent Application No. 10-2010-0126779 filed Dec. 13, 2010, the subject matter of which is hereby incorporated by reference.

BACKGROUND OF THE INVENTION

Embodiments of the inventive concept relate to data writing devices incorporate into memory linked architectures. More particularly, embodiments of the inventive concept relate to data writing devices for memory linked architectures that are capable of providing improved data writing speeds. Other embodiments of the inventive concept relate to methods of operating a data writing device within memory linked architectures.

FIG. 1 is a block diagram illustrating in relevant part a data system. Referring to FIG. 1, a data system 100 comprises a Read Only Memory (ROM) writer 110 arranged in relation to a plurality of memory socket assemblies 120-1 to 120-m, each including a socket adapted to mount a memory device. That is, each socket may be used to mechanically and electrically connect a corresponding memory link architecture (MLA) configured to receive data (e.g., image data) as conventionally written by the ROM writer 110.

For example, the ROM writer 110 may selectively write "image data" in preparation for execution of an application by a host CPU (not shown). Image data may include, for example, Operating System (OS) image data, a boot program, a boot loader, flash translation layer (FTL) code, and other programming code necessary to operation of the memory link architectures respectively associated with the memory socket assemblies 121-1 to 121-m.

The ROM writer 110 comprises a CPU 111, a primary memory 112, and a plurality of control devices 113-1 to 113-m. During an operation designed to transfer image data from the ROM writer 110 to the MLAs of the plurality of memory socket assemblies 121-1 to 121-m-1 to 120, the ROM writer is solely used to accomplish said transfer.

Thus, each MLA must be downloaded with image data in sequence using the ROM writer 110 once all of the MLAs have been mounted in their respective sockets. This requires a rather large block of time during which nothing else can happen as the memory system is being configured. That is, the CPU 111 of the ROM writer 110 is only able to write image data on a write operation by write operation basis in relation to multiplicity of connected MLAs, and only after that are all mounted. As the number of MLAs increases within a particular host device, the associated delay in MLA download configuration only increases. Accordingly, some method of improving the speed of data download to a number of memory link architectures is needed.

SUMMARY OF THE INVENTION

In one embodiment, the inventive concept provides a data system, comprising; a Read Only Memory (ROM) writer comprising a Central Processing Unit (CPU) and first memory, and configured to provide data, and a plurality of memory socket assemblies (MSAs), each MSA being configured to mechanically mount and thereby electrically connect a memory link architecture (MLA) and comprises a second memory and a control device configured to independently control a transfer of the data from the ROM writer to the second memory and a transfer of the data from the second memory to the MLA, wherein the transfer of the transfer of data from the ROM writer to the second memory occurs before the MLA is mounted into the MSA.

In another embodiment, the inventive concept provides a method, comprising; transferring first data from a Read Only Memory (ROM) writer to a first memory socket assembly (MSA), the first MSA being configured to mechanically mount and thereby electrically connect a first memory link architecture (MLA) and comprising a first memory and a first control device, transferring second data from the ROM writer to a second MSA, the second MSA being configured to mechanically mount and thereby electrically connect a second MLA and comprising a second memory and a second control device, after transferring the first data from the ROM writer to the first MSA, mounting the first MLA in the first MSA, and after mounting the first MLA in the first MSA, transferring the first data from the first memory to a nonvolatile memory in the first MLA.

In another embodiment, the inventive concept provides a method, a method, comprising; transferring data from a Read Only Memory (ROM) writer to a plurality of memory socket assembly (MSA), each MSA being configured to mechanically mount and thereby electrically connect a memory link architecture (MLA) and comprising a memory and a control device, and only after transferring the data from the ROM writer to at least one of the plurality of MSA but before mounting a corresponding MLA in each one of the plurality of MSAs, writing the data from a memory in one MSA to a corresponding nonvolatile memory in the one MSA.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
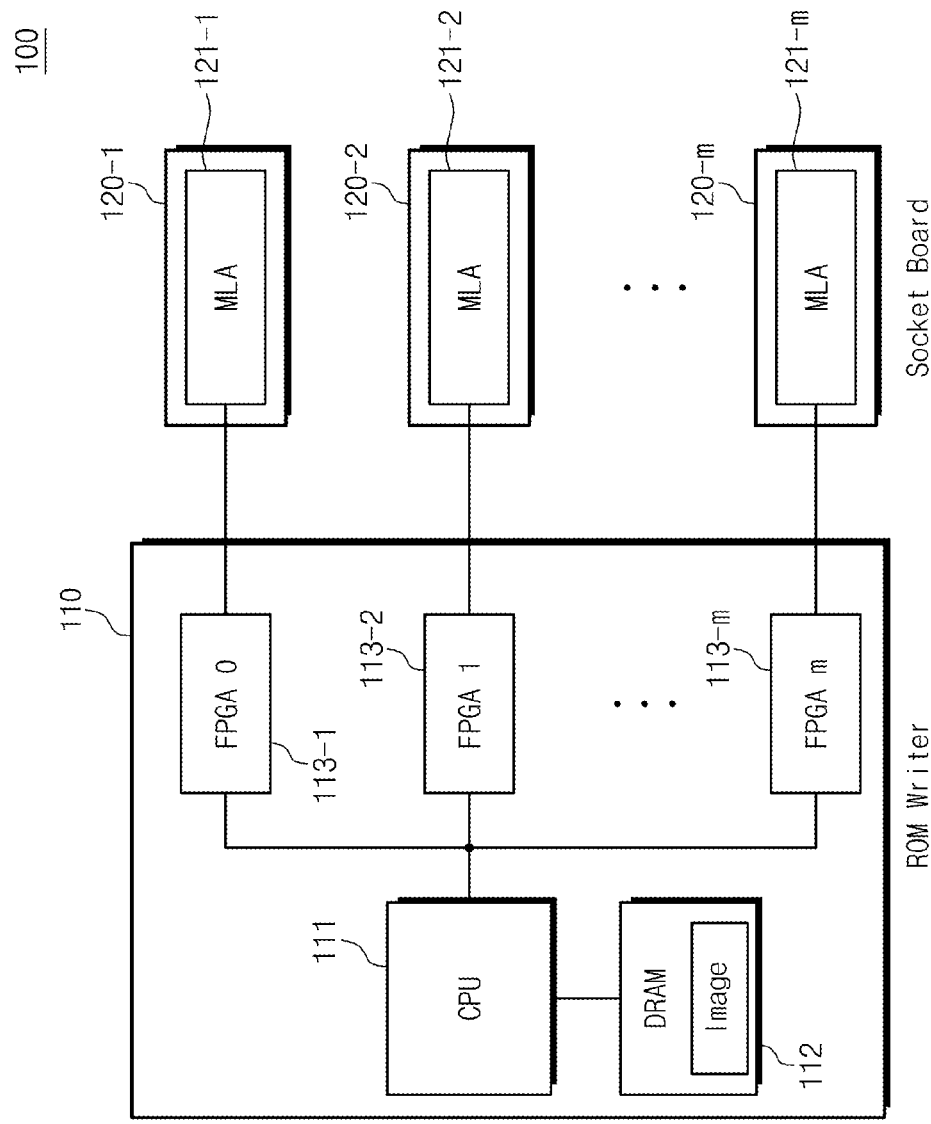
FIG. 1 is a block diagram illustrating a conventional data system.

Certain embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like of similar elements.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
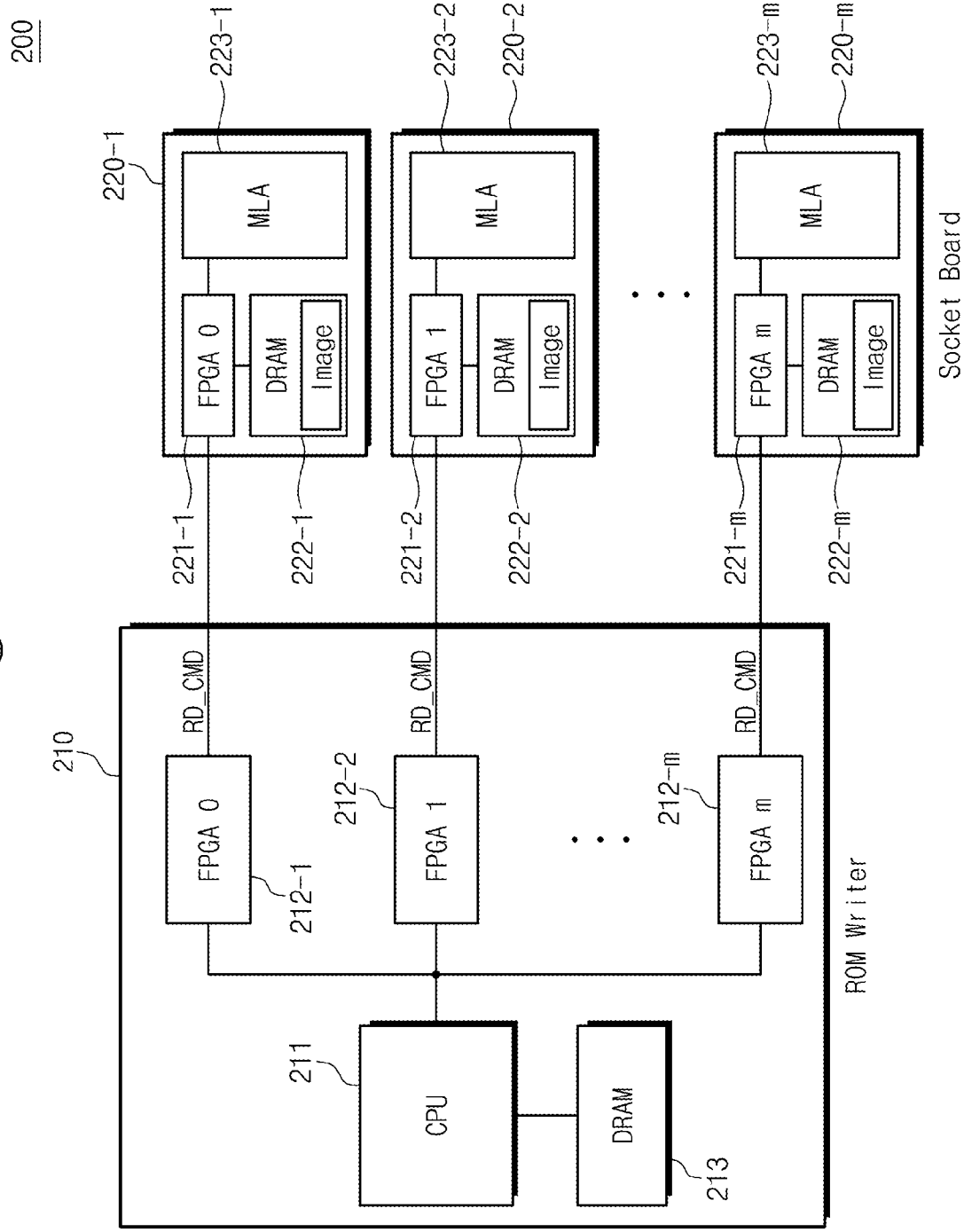
FIG. 2 is a block diagram illustrating a data system according to an embodiment of the inventive concept.

FIG. 2 is a diagram illustrating a data system according to an embodiment of the inventive concept. Referring to FIG. 2, a data system 200 comprises a ROM writer 210 and a plurality of memory socket assemblies (MSAs) 220-1 to 220-m.

The ROM writer 210 comprises a Central Processing Unit (CPU) 211, the first memory 213, and a plurality of first control devices 212-1 to 212-m.

The CPU 211 controls the overall operation of the ROM writer 210. For example, the CPU 211 may be used to generate one or more control signals, commands, and/or data packets related to same (hereafter, collectively and singularly referred to as "control signals") including a read command RD_CMD that causes a write operation to be performed in relation to one or more of the memory devices arranged in the plurality of memory socket assemblies 220-1 to 220-m.

Respectively, the first control devices 212-1 to 212-m may be used to directly transfer control signals including a read command RD_CMD provided by the CPU 211 to a corresponding one of a plurality of second control devices 221-1 to 221-m respectively associated with each one of the plurality of memory socket assemblies 220-1 to 220-m. That is, on a functional basis, the combination of a first control device 212 and a second control device 221 may be used to transfer data from the ROM writer 210 to a memory device mounted in a corresponding one of the plurality memory socket assembly 220.

The first (or primary) memory 213 may be used to store data needed to control the operation of the ROM writer 210.

Each one of the plurality of memory socket assemblies 220-1 to 220-m includes a conventional mechanical socket into which one or more memory devices may be mounted. The illustrated example of FIG. 2 assumes that each one of the plurality of memory socket assemblies comprises a memory link architecture MLA 223-1 to 223-m, a second control device 221-1 to 221-m, and a second (or secondary) memory 222-1 to 222-m. The combination of these elements in relation to each board socket is termed "a memory socket assembly" 220-1 to 220-m. A write operation directed to one or more the MLAs associated with the plurality of socket boards 220-1 to 220-m may be performed by first reading (or retrieving) image data provided by the ROM writer 210 and stored in a corresponding second memory 222-1 to 222-m in response to a read command RD_CMD. That is, each one of the second control devices 221-1 to 221-m essentially controls the provision (or "writing") of image data to each one of the corresponding memory link architectures 223-1 to 223-m using a second memory 222-1 to 222-m.

In the illustrated embodiment of FIG. 2, each memory socket assembly 220-1 to 220-m is assumed to include a MLA incorporating a multi-port memory, such as the oneDRAM® provided by Samsung Electronics Co. Ltd. With this configuration, each one of the second control devices 221-1 to 221-m may access the multi-port DRAM using a DRAM interface conventionally provided by each one of the MLAs 223-1 to 223-m. For example, access by a second control device to a corresponding MLA may be had via a port connecting a shared memory area of the multi-port DRAM.

In certain embodiments of the inventive concept, each one of the first control devices 212-1 to 212-m and each one of the second control devices 221-1 to 221-m may be implemented using a corresponding field-programmable gate array (FPGA).

Image data may be respectively stored in the second memories 222-1 to 222-m using the ROM writer 210 when a memory socket assembly 220-1 to 220-m is first functionally connected with the ROM writer 210.

In FIG. 2, the second memories 222-1 to 222-m are assumed to be implemented using respective (Dynamic Random Access Memory) DRAM devices, but other types of memory may be used, such as Static Random Access Memory (SRAM).

So-called "image data" stored in the second memories 222-1 to 222-$m$ may include, for example, Operating System (OS) data, a boot loader, flash translation layer (FTL) code, application program code, file system data, and similar information necessary to the operation of each memory link architecture.

Figure 3:
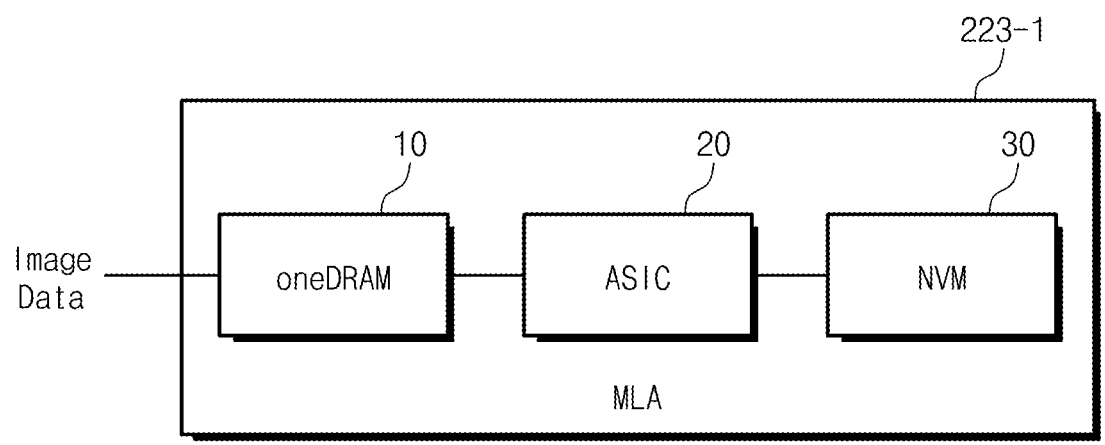
FIG. 3 is a block diagram further illustrating one possible memory link architecture (MLA) that may be used in conjunction with the data system of FIG. 2.

FIG. 3 is a block diagram illustrating one possible memory link architecture that may be used in a memory socket assembly like the ones shown in FIG. 2. A memory link architecture (MLA) 223-1 comprises multi-port memory 10, such as the oneDRAM®, an Application Specific Integrated Circuit (ASIC) 20, and a Nonvolatile memory (NVM) 30. A corresponding second control device 221-1 may be used to transfer data to and from the MLA 223-1 when mounted in socket board 220-1. As is conventionally understood, the multi-port memory 10 may interface with the second control device 221-1 via (e.g.,) a DRAM interface to a shared memory area in order to store image data retrieved from second memory 222-1.

The ASIC 20 may serve as a nonvolatile memory controller capable of reading image data from (e.g.,) a shared memory area of the multi-port memory 10 and writing this image data to the NVM 30 using conventionally understood techniques.

Once a particular write operation directed to NVM 20 of MLA 223-1 is complete, the second control device 221-1 may terminate the transfer of image data by outputting a write end signal to the CPU 211 of the ROM writer 210.

The nonvolatile memory 30 may be formed of EEPROM, a flash memory, a magnetic RAM (MRAM), a spin-transfer torque MRAM, a conductive bridging RAM (CBRAM), a ferroelectric RAM(FeRAM), a phase change RAM (PRAM) called a so-called ovonic unified memory (OUM), a resistive RAM (RRAM or ReRAM), a nanotube RRAM, a polymer RAM (PoRAM), a nano floating gate memory (NFGM), a holographic memory, a molecular electronics memory device, or an insulator resistance change memory. Further, the nonvolatile memory 30 can be formed of ROM.

In case of a data writing device 200 according to an embodiment of the inventive concept, image data to be written is stored in the second memories 222-1 to 222-$m$ within memory socket assemblies 220-1 to 220-$m$, and control signals including a read command RD_CMD for controlling a write operation are only provided from a ROM writer 210.

Accordingly, it is possible to read image data stored in the second memories 222-1 to 222-$m$ within the socket boards 220-1 to 220-$m$ independently and simultaneously and to write it in memory link architectures 223-1 to 223-$m$. As compared with data writing device 100 of FIG. 1, the speed with which image data may be written is improved. Further, it is possible to transfer image data stably by making the final transfer of image data to a nonvolatile memory on a board level (i.e., between components arranged in a common memory socket assembly).

Figure 4:
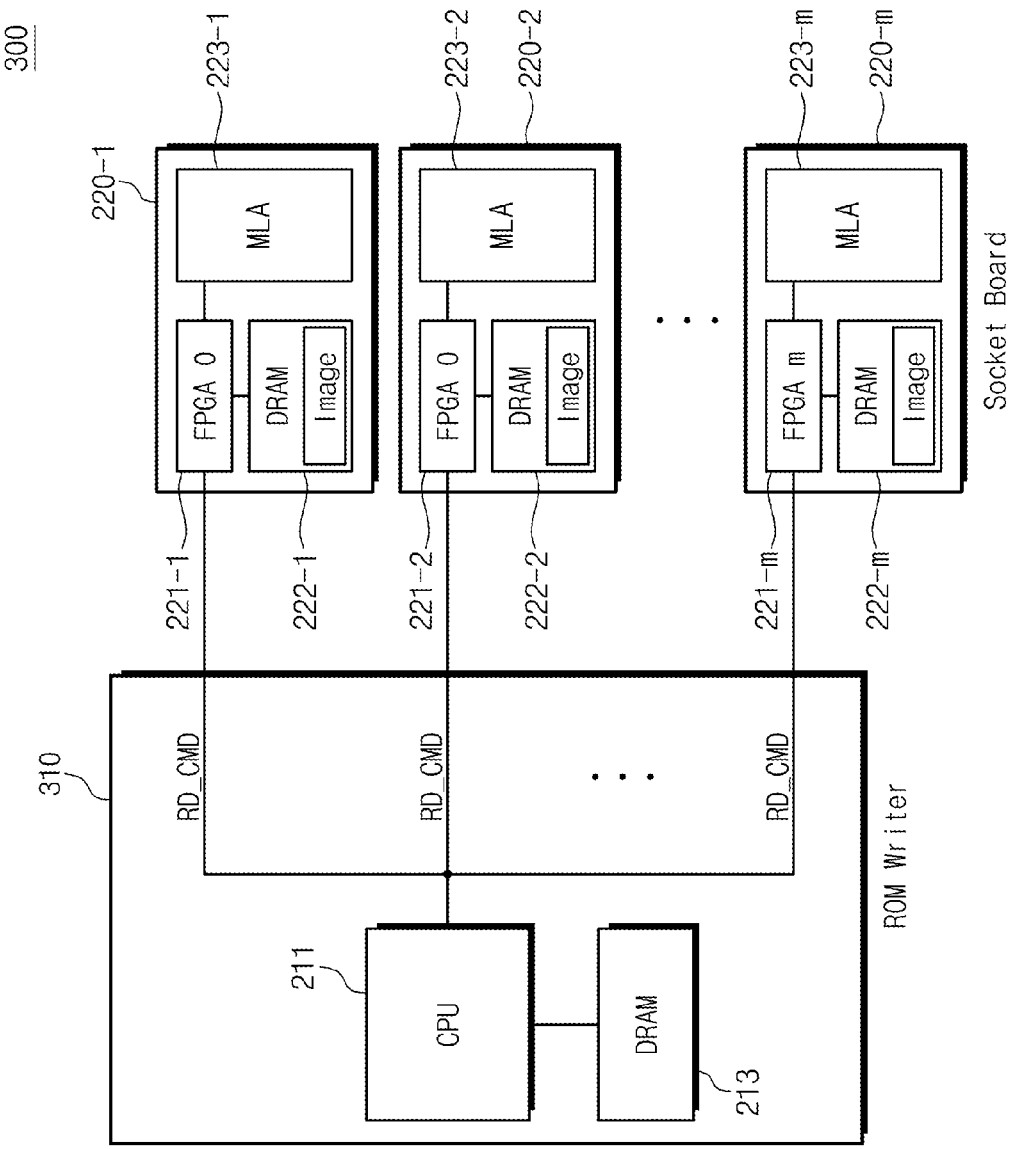
FIG. 4 is a block diagram illustrating a data system according to another embodiment of the inventive concept.

FIG. 4 is a diagram illustrating a data writing system according to another embodiment of the inventive concept. Referring to FIG. 4, a ROM writer 310 included in the data writing system 300 does not include the first control devices 212-1 to 212-$m$ in contrast to the embodiment illustrated in FIG. 2.

The ROM writer 310 is configured such that control signals including a read command RD_CMD are generated from a CPU 211 are directly transferred to the second control devices 221-1 to 221-$m$ included within the respective memory socket assemblies 220-1 to 220-$m$ for execution of data writing operations.

The second control devices 221-1 to 221-$m$, the second memories 222-1 to 222-$m$, and memory link architectures 223-1 to 223-$m$ included in the socket boards 220-1 to 220-$m$ are substantially identical to those described in FIG. 2, and description thereof is thus omitted.

Figure 5:
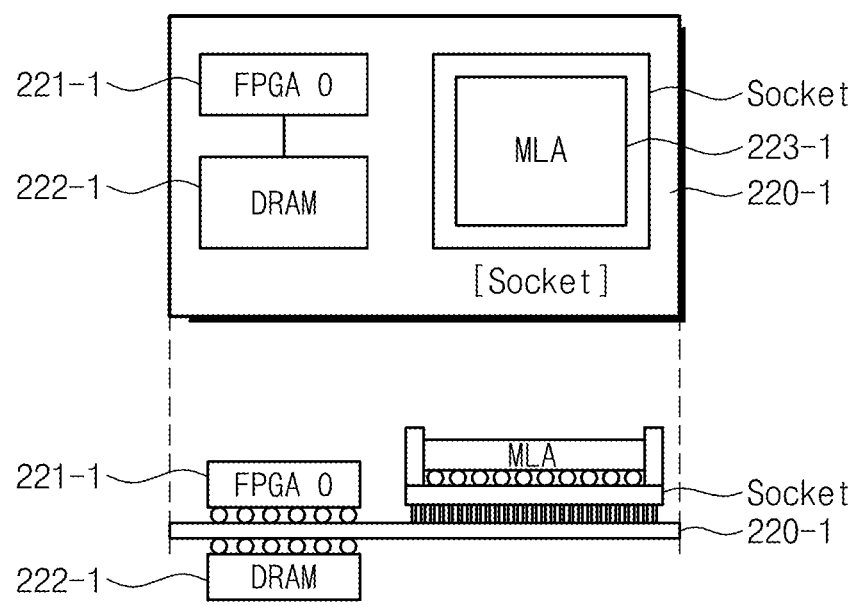
FIG. 5 includes plan and profile diagrams further illustrating a memory socket assembly that may be used in the embodiments of FIGS. 2 and 3.

FIG. 5 includes plan and profile diagrams illustrating a memory socket assembly 220-1 of FIGS. 2 and 3. Referring to FIGS. 2 to 5, the memory socket assembly 220-1 includes a mechanical socket configured to mount the memory link architecture (MLA) 223-1 and a substrate on which the second control device 221-1 and the second memory 222-1 are mounted.

Figure 6:
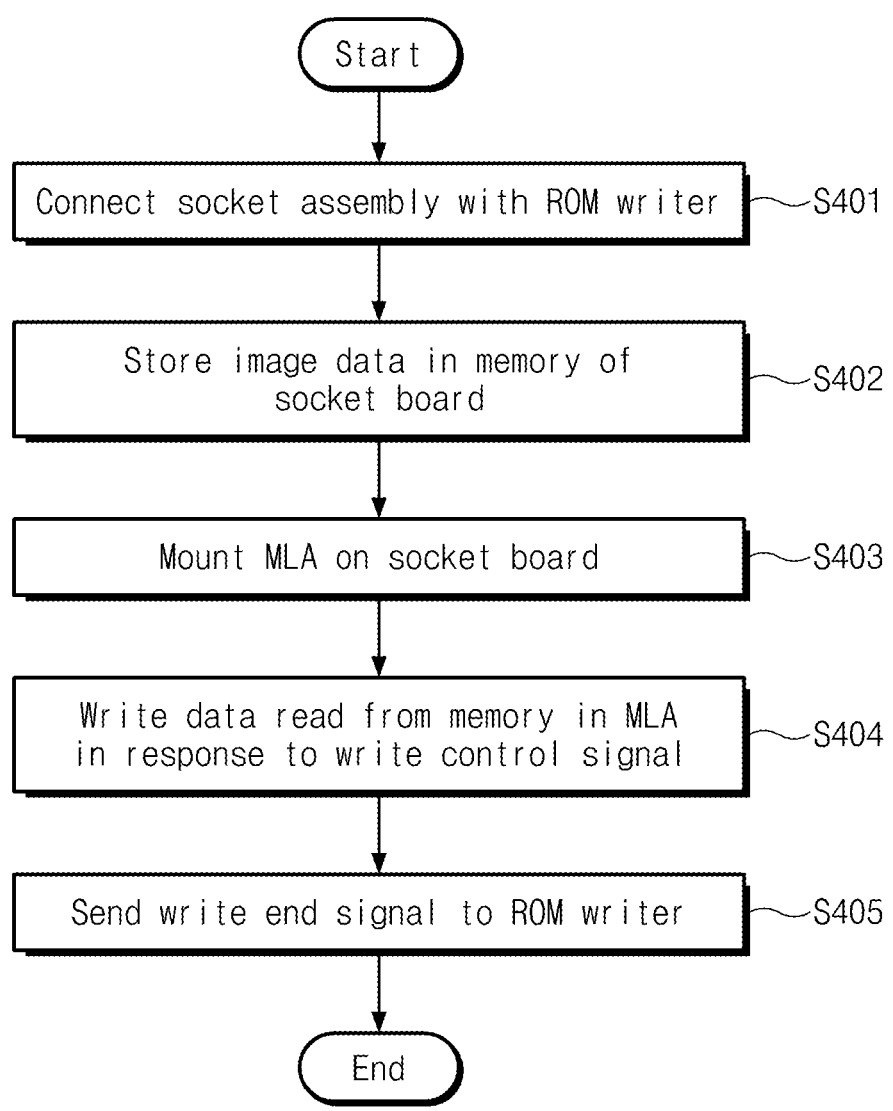
FIG. 6 is a flowchart summarizing a method of writing data within a data system including a multiplicity of MLAs according to an embodiment of the inventive concept.

FIG. 6 is a flowchart summarizing a data writing method according to an embodiment of the inventive concept. Referring to FIGS. 2, 4, and 6, before a data write operation may be performed, one or more memory socket assemblies 220, including at least the second control device 221 and the second memory 222, must be connected to the ROM writer 210/310 (S401). With the memory socket assembly 220-1 connected to the ROM writer 210/310, image data may be transferred from the CPU 211 to the second memory 222-1 through the second control device 221-1 (S402). Now, the MLA 223-1 may be mounted (i.e., mechanically and electrically connected) in a socket associated with a memory socket assembly 220-1 (S403). Once the MLA 223-1 is mounted, image data may be written from the second memory 222-1 to the nonvolatile memory of the MLA 223-1 using the second controller 221-1 (S404). Following completion of the transfer of image data from the second memory 222-1 to the nonvolatile memory of the MLA 223-1 via the second controller 222-1, the "downloading" of the image data to an intended MLA of a particular memory socket assembly may be terminated by communication of a write end signal to the ROM writer 210/310 (S405).

The foregoing method may be used as part of an assembly process that provides a memory system within a host device. Using the foregoing approach, data may be pre-written to secondary memories respectively associated with each one of a plurality of memory socket assemblies—each memory socket assembly thereafter receiving an memory link architecture. The data having been pre-written to the secondary memory, it may be immediately written to the MLA upon connection into the memory socket assembly, without bulk data transfer by a connected ROM writer. Hence, the operational burden placed on the ROM writer may be divided between pre-writing operations, with final writing operations being performed by second control devices respectively associated with each memory socket assembly. As a result, a great block of time is not required to download "data" to a multiplicity of MLAs using the ROM writer.

It should be noted that the embodiments described above, assume "image" data as a type that may be usefully written to multiple MLAs within embodiments of the inventive concept. However, may type of data may be written in the foregoing manner.

The above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A data system, comprising:
   a Read Only Memory (ROM) writer comprising a Central Processing Unit (CPU), first control devices, and first memory, wherein the ROM writer is configured to provide data; and
   a plurality of memory socket assemblies (MSAs), each MSA having a socket configured to mechanically mount and thereby electrically connect a memory link architecture (MLA),
   wherein each MSA comprises a respective second memory and a respective second control device connected to one of the first control devices, each MSA being configured to control a first transfer of the data received from the ROM writer to the second memory and to control a second transfer of the data from the second memory to the MLA, wherein the first transfer of the data from the ROM writer to the second memory via the second control device occurs before the MLA is mounted into the socket of the MSA.

2. The system of claim 1, wherein each one of first control devices is configured to be independently controlled by the CPU, to transfer the data stored in the first memory via the CPU to a corresponding second control device of one of the plurality of MSAs.

3. The system of claim 2, wherein each one of the first control devices is a field-programmable gate array (FPGA).

4. The system of claim 3, wherein each one of the second control devices is a field-programmable gate array (FPGA).

5. The system of claim 1, wherein each one of the second control devices is directly connected to a corresponding one of the first control devices.

6. The system of claim 1, wherein each second memory is a Dynamic Random Access Memory (DRAM).

7. The system of claim 1, wherein each MLA mounted in a socket of a corresponding MSA comprises:
   a nonvolatile memory (NVM) that stores the data received from a second memory;
   a multi-port memory device that interfaces with a corresponding second control device to transfer the data stored in the second memory to the NVM; and
   an application specific integrated circuit (ASIC) that serves as a memory controller for the NVM and controls transfer of the data from the multi-port memory device to the NVM.

8. The system of claim 7, wherein the data is image data including at least one of Operating System (OS) data, boot loader data, and flash translation layer (FTL) data.

9. The system of claim 7, wherein one second control device of a first MSA in the plurality of MSAs performs the first transfer while another second control device of a second MSA in the plurality of MSAs performs the second transfer.

10. The method of claim 7, wherein the data is image data including at least one of Operating System (OS) data, boot loader data, and flash translation layer (FTL) data.

11. The system of claim 1, wherein each respective second memory is operatively connected to only a corresponding second control device on the same MSA to receive the data from the ROM writer.

12. The method of claim 11, wherein transferring the data from the second memory to the NVM of the MLA under the control of the second device controller is performed in response to a write control signal provide by the CPU.

13. A method of writing data to a plurality of memory link architectures (MLAs) using a Read Only Memory (ROM) writer, the method comprising:
   transferring data from a first memory on the ROM writer to a second memory on a first-memory socket assembly (MSA) using both a first device controller on the ROM writer and a second device controller on the first MSA and storing the data in the second memory, wherein the first MSA includes a first socket configured to mechanically mount and thereby electrically connect a first memory link architecture (MLA) having a first nonvolatile memory (NVM);
   after transferring the data to the second memory of the first MSA, mounting the first MLA in the first socket; and
   after mounting the first MLA in the first socket, transferring the data from the second memory of the first MSA to the first NVM of the first MLA under the control of the second device controller.

14. The method of claim 13, further comprising:
   while transferring the data from the second memory of the first MSA to the first NVM of the first MLA, mounting a second MLA in a second socket of a second MSA after having transferred data from the first memory to a second memory of the second MSA using both the first device controller and the second device controller on the second MSA second memory.

15. The method of claim 13, wherein the ROM writer further comprises:
   a plurality of first control devices, each respectively configured to directly transfer the data from the first memory via the CPU to a corresponding one of a plurality of second control devices respectively disposed on different MSAs along with a corresponding second memory.

16. The method of claim 15, wherein the first memory and each second memory is a Dynamic Random Access Memory (DRAM).

17. The method of claim 13, wherein the first MLA comprises:
   a nonvolatile memory (NVM) that stores the data;
   a multi-port memory device that interfaces with the first control device to transfer the data from the second memory of the first MSA to the NVM: and
   an application specific integrated circuit (ASIC) that serves as a memory controller for the NVM and receives the data from the multi-port memory device and controls the writing of the data to the NVM.

18. The method of claim 13, wherein the second memory on the first MSA is operatively connected to only the second device controller on the first MSA to receive the data from the ROM writer.

19. The method of claim 18, further comprising:
   sending a write end signal from the MSA to the ROM writer after storing the data in the NVM of the MLA.

20. A method of writing data to a plurality of memory link architectures (MLAs) using a Read Only Memory (ROM) writer including a Central Processing Unit (CPU), a first memory, and first device controllers, the method comprising:
   mechanically connecting a socket of a memory socket assembly (MSA) to a ROM writer, wherein the socket is configured to mechanically mount and thereby electrically connect a memory link architecture (MLA) having a nonvolatile memory (NVM), and the MSA comprises a second device controller directly connected to a corresponding one of the first device controllers, and a second memory;
   using one of the first device controllers connected to only the second device controller of the MSA, transferring the data from the first memory to the second memory;

only after transferring the data from the first memory to the second memory, mounting the MLA in the socket; and
only after mounting the MLA in the socket, transferring the data from the second memory to the NVM of the MLA under the control of the second device controller.

* * * * *